United States Patent [19]
Barthelt

[11] Patent Number: 6,162,993
[45] Date of Patent: Dec. 19, 2000
:::

[54] SIGNAL CONDUCTOR

[75] Inventor: Klaus Barthelt, Grafschaft, Germany

[73] Assignee: Stemmann-Technik GmbH, Schüttorf, Germany

[21] Appl. No.: 09/142,262

[22] PCT Filed: Jan. 16, 1998

[86] PCT No.: PCT/DE98/00137

§ 371 Date: Sep. 3, 1998

§ 102(e) Date: Sep. 3, 1998

[87] PCT Pub. No.: WO98/32193

PCT Pub. Date: Jul. 23, 1998

[30] Foreign Application Priority Data

Jan. 17, 1997 [DE] Germany ............... 197 01 510

[51] Int. Cl.⁷ ................................................. H01B 11/02
[52] U.S. Cl. ................................. 174/117 F; 174/117 FF
[58] Field of Search .................... 174/117 F, 117 FF, 174/250, 36, 70 B, 71 B

[56] References Cited

U.S. PATENT DOCUMENTS

| | | | |
|---|---|---|---|
| 4,926,008 | 5/1990 | Shreeve | 174/117 FF |
| 5,083,238 | 1/1992 | Bousman | 361/413 |
| 5,105,055 | 4/1992 | Mooney et al. | 174/27 |
| 5,235,132 | 8/1993 | Ainsworth et al. | 174/36 |
| 5,274,195 | 12/1993 | Murphy et al. | 174/117 FF |
| 5,426,399 | 6/1995 | Matsubayashi et al. | 333/1 |
| 5,446,239 | 8/1995 | Muzutani et al. | 174/36 |
| 5,556,300 | 9/1996 | Parker | 439/497 |
| 5,814,769 | 9/1998 | Karlstrom et al. | 174/117 FF |
| 5,847,324 | 12/1998 | Farquhar et al. | 174/117 FF |

FOREIGN PATENT DOCUMENTS

| | | |
|---|---|---|
| 3210826 | 9/1985 | Germany . |
| 9204717 | 6/1992 | Germany . |
| 9116310 | 9/1992 | Germany . |
| 9214898 | 12/1992 | Germany . |
| 4402082 | 8/1994 | Germany . |

*Primary Examiner*—Kristine Kincaid
*Assistant Examiner*—William H. Mayo, III
*Attorney, Agent, or Firm*—Friedrich Kueffner

[57] ABSTRACT

A signal conductor for high-frequency signals has a first carrier layer and a second carrier layer each having a suitable dielectricity. At least one electrically conducting signal path is provided and is positioned at a lateral spacing between first and second electrically conducting ground paths. The electrically conducting signal path and the first and second electrically conducting ground paths are positioned between the first and second carrier layers. A first shield is connected to the first carrier layer at a side of the first carrier layer facing away from the second carrier layer. A plastic sheeting is connected to the second carrier layer at a side of the second carrier layer facing away from the first carrier layer. A second shield is connected to the plastic sheeting remote of the second carrier layer. The plastic sheeting has connection lugs, and the second shield has a cutout at a location where the connection lugs are arranged on the plastic sheeting. Electrically contacting contact strips, designed to contact at least three slip rings of a slip ring body, are positioned on a side of the connection lugs remote from the second carrier plate and electrically contact the electrically conducting signal path and the first and second electrically conducting ground paths via the connection lugs.

1 Claim, 1 Drawing Sheet

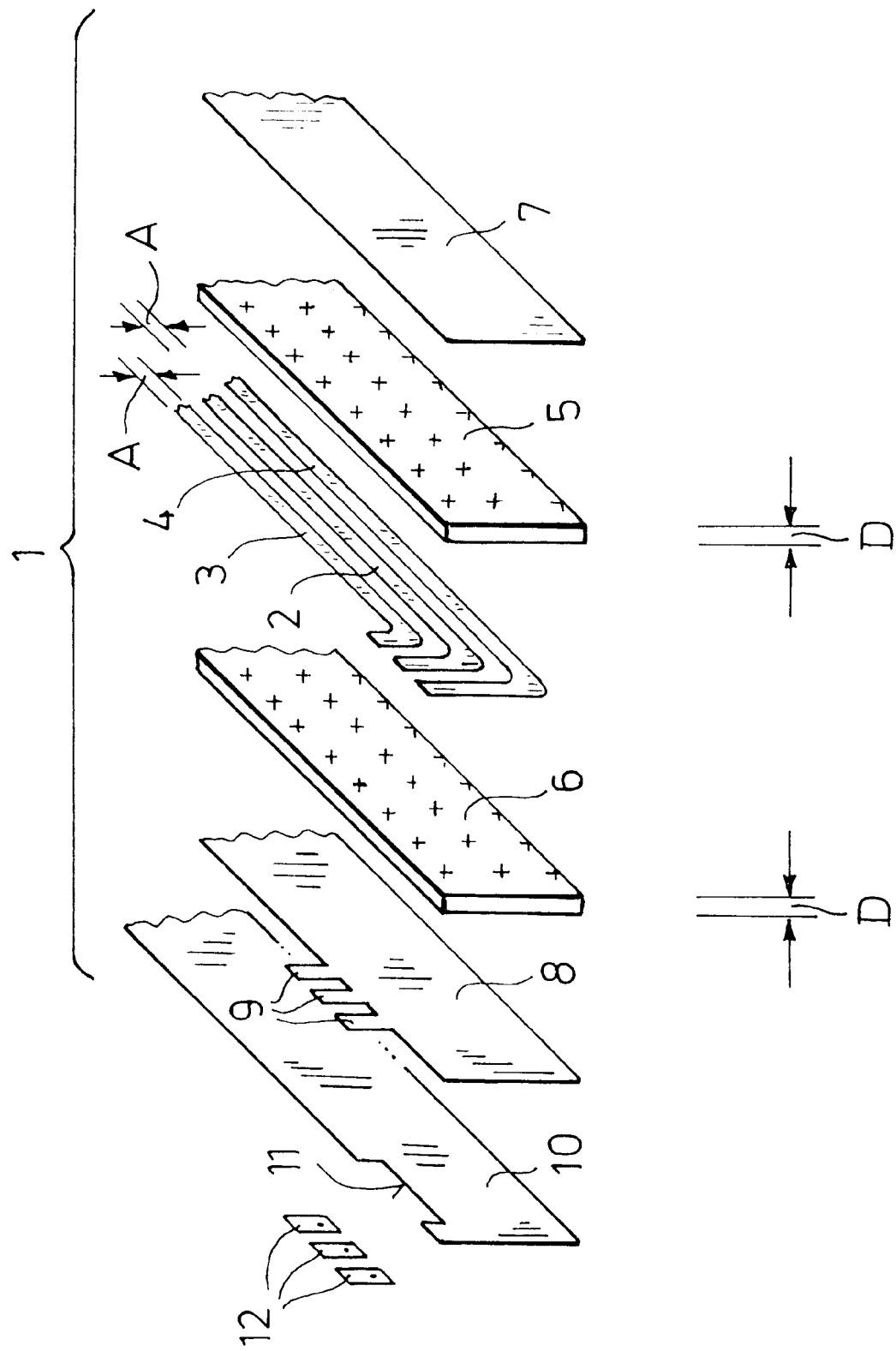

SIGNAL CONDUCTOR

BACKGROUND OF THE INVENTION

1. Field of the Invention

The invention is directed to a signal conductor for high-frequency signals for connection with at least three slip rings of a slip ring body.

In technical respects relating to high frequency, it is very problematic to connect a plurality of coaxial cables with the slip rings of a slip ring body. This is due to the fact that the shielding must be carefully removed from long portions of the coaxial cables so that both the inner conductor and shielding can be contacted with the slip rings. In view of the fact that the coaxial cables usually have a large diameter, the quantity of coaxial cables that can be accommodated is also necessarily limited. In addition, the effort is made in practice to keep the diameter of the slip rings as small as possible because as the diameter increases, the diameter of the housing overall increases exponentially.

2. Description of the Related Art

The separation of the shielding of a coaxial cable from the dielectric always produces a point of discontinuity and, as a result, reflections and interference signals. A discontinuous point increases the via net loss or transmission loss, having a very negative effect on the quality of signal transmission.

A further characteristic of known high-frequency slip ring bodies is the complicated bonding or contacting. For this reason, they were produced only as composite bodies, that is, the slip rings were embedded along with the coaxial cables in casting resin. However, casting resins of this type have very high dielectric values with disadvantageous consequences in terms of the geometric dimensions of the slip ring bodies. These dimensions were simply too large.

SUMMARY OF THE INVENTION

Proceeding from the prior art, the object of the invention is to provide a signal conductor for high-frequency signals for connection with the slip rings of a slip ring body, which signal conductor is not only constructed in a simple manner requiring a small installation space, but in which the stripping of insulation is dispensed with and solder joints between thin wires are no longer required.

In accordance with the present invention, the signal conductor for high-frequency signals for connection with at least three slip rings of a slip ring body is primarily characterized in that it has at least one electrically conducting signal path spaced at a distance laterally between two electrically conducting ground paths, that the signal path and the ground paths are arranged between two carrier layers having a suitable dielectricity, that a first shield is provided on the side of a carrier layer remote of the signal path and the ground paths, that plastic sheeting having connection lugs is arranged on the side of the other carrier layer remote of the signal path and the ground paths, that a second shield having a cutout in the region of the connecting lugs is provided on the side of the plastic sheeting remote of the signal path and the ground paths, that electrically contacting contact strips on the sides of the connection lugs remote of the signal path and the ground paths are connected with the signal path and the ground paths.

The basic construction type according to the invention provides an electrically conducting signal path between two electrically conducting ground signal path and the ground paths. The paths are preferably made of copper. In order to achieve the desired impedance, a spacing is provided between the signal path and the ground paths arranged adjacent and parallel thereto, wherein this spacing depends on the dielectric. Consequently, the geometric dimensions of the signal conductor are also determined by the dielectric. However, it is no longer a problem to provide a plurality of signal paths and ground paths adjacent to one another and this depends only on the available space within a slip ring body, wherein, however, every signal path must always lie between two ground paths.

Depending on the quantity of signal path and the ground paths, these signal path and the ground paths are now arranged between two carrier layers with a suitable dielectricity that is adapted to the desired impedance. The carrier layers can be formed of laminate-like carrier plates. For this purpose, it is conceivable that one of the carrier plates has copper laminated to one side, wherein the signal path and the ground paths are etched out of the copper lamination. However, the signal path and the ground paths can also be constructed and arranged in other ways.

A shield is applied to the other side of a carrier layer that is provided with signal path and the ground paths in this way. In particular, this shield can be formed of a copper layer, e.g., a copper foil.

The carrier layer that is not provided with signal path and the ground paths is provided on the side remote of the signal path and the ground paths with a plastic sheeting having transversely projecting connection lugs, wherein the quantity of connection lugs corresponds to the quantity of signal paths and ground paths.

The side of the plastic sheeting remote of the signal path and the grounds paths is then likewise provided with shielding, e.g., a copper foil, which is, however, cut out in the area of the connection lugs.

Subsequently, the signal path and the ground paths are bonded through the carrier layer and the plastic sheeting with electrically conducting contact strips which are, in particular, made from copper, so that an electrically conducting connection is formed between the signal path and the ground paths and the contact strips which can be connected with the slip rings.

A signal conductor which is constructed in this way, especially a plate-like signal conductor which can be integrated, without soldering, in the central region of a slip ring body has a number of advantages.

One advantage is that two signal conductors of this kind can be placed against one another to form a multiple-layer plate. The contact strips then extend on both sides transverse to the longitudinal extension of the signal conductor. The quantity of contacts can be doubled within virtually the same installation space by means of this step.

A further advantage is that the contact strips can be clamped only between insulator rings and the slip rings stacked on the carrier shaft of the slip ring body when installing the signal conductor in a slip ring body. A solder connection is not needed.

Since the spacing between the signal path and the ground paths which run parallel to one another can be maintained exactly identical along the entire length of the signal path and the ground paths within the framework of the invention, it is possible in an advantageous manner to maintain the impedance absolutely and in a reproducible manner along this entire length, e.g., between a plug connector and the associated slip ring. The reproducibility is provided in particular due to the fact that the construction can always be maintained identical through the configuration of the signal conductor and the manufacture determined by this configuration.

A further particular advantage is connected with the invention in that insulating rings of the type mentioned above can now be used between the slip rings, wherein the material of the insulating rings has only small dielectric values. The use of materials with low dielectric values accordingly appreciably reduces the installation space, which is suitable for the high-frequency system discussed herein in an extremely advantageous manner and broadens its range of application.

The use of a signal conductor according to the invention having the special feedthrough or through-contacting between the signal path and the ground paths and the contact strips creates fundamentally reproducible conditions. It also enables stacking. This makes repairs possible and speeds up assembly because time-consuming work steps such as stripping of insulation and soldering of usually very thin wires are not required.

In all, it may be stated that it is possible not only to produce slip ring bodies which are very compact in diameter as well as length and which comprise a plurality of slip rings, but also, in view of the absence of points of discontinuity— in that no portion of the shield need be removed—the transmission loss can be kept extremely low and, therefore, the quality of transmission of high-frequency signals can be influenced in an extremely positive manner.

BRIEF DESCRIPTION OF THE DRAWING

The invention is explained more fully hereinafter with reference to an embodiment example shown in the drawing.

In an exploded view, a length portion of a plate-shaped signal conductor for high-frequency signals for connection with three slip rings of a slip ring body, not shown more fully, is designated by 1.

DESCRIPTION OF THE PREFERRED EMBODIMENTS

The signal conductor 1 is installed axially in the slip ring body. It has an electrically conducting L-shaped signal path 2 made of copper. Next to this signal path 2 at a predefined distance A from this signal path 2 are two electrically conducting ground paths 3, 4 which extend parallel to one another and are made of copper. The signal path 2 and the ground paths 3, 4 are arranged between two carrier plates 5, 6 with a suitable dielectric. One side of the first carrier plate 5 is laminated with copper and the signal path 2 and the ground paths 3, 4 are etched out of the copper lamination. The dielectric of the carrier plates 5, 6 also determines the spacing A between the signal path 2 and the ground path 3 and between the signal path 2 and the ground path 4 as well as the thickness D of the carrier plates 5, 6. The spacing A and thickness D in turn determines the desired impedance.

On the side remote of the paths 2–4, the first carrier plate 5 is covered with a first shield in the form of a copper foil 7.

The side of the second carrier plate 6 remote of the signal path 2 and the ground paths 3, 4 is provided with a plastic sheeting 8 with a quantity of transversely extending connection lugs 9 corresponding to the quantity of the signal path 2 and the ground paths 3, 4.

A second shield in the form of a copper foil 10 having a cutout 11 in the area of the connection lugs 9 is also arranged on the side of the plastic sheeting 8 remote of the the signal path 2 and the ground paths 3, 4.

Copper contact strips 12 are then contacted, via the connection lugs 9 of the plastic sheeting 8, with the the signal path 2 and the ground paths 3, 4 between the first and second carrier plates 5, 6.

When the signal conductor 1 is assigned to a slip ring body, each of the contact strips 12 can be clamped between a slip ring and an insulating ring. Consequently, solder connections are not required.

Signals can be transmitted via the signal path 2 to the corresponding contact strips 12, and accordingly to a slip ring, by means of the signal conductor 1.

Reference Numbers

1 signal conductor
2 signal path
3 ground path
4 ground path
5 carrier plate
6 carrier plate
7 copper foil
8 plastic sheeting
9 connection lugs
10 copper foil
11 cutout in 10
12 contact stripes
A distance between 2 and 3 and between 2 and 4
D thickness of 5, 6

What is claimed is:

1. A signal conductor for high-frequency signals comprising:

a first carrier layer and a second carrier layer each having a suitable dielectricity;

at least one electrically conducting signal path;

first and second electrically conducting ground paths, wherein the electrically conducting signal path is positioned at a lateral spacing between the first and second electrically conducting ground paths and wherein the electrically conducting signal path and the first and second electrically conducting ground paths are positioned between the first and second carrier layers;

a first shield connected to the first carrier layer at a side of the first carrier layer facing away from the second carrier layer;

a plastic sheeting connected to the second carrier layer at a side of the second carrier layer facing away from the first carrier layer;

a second shield connected to the plastic sheeting remote of the second carrier layer;

the plastic sheeting having connection lugs;

the second shield having a cutout at a location where the connection lugs are arranged on the plastic sheeting;

electrically contacting contact strips, configured to contact at least three slip rings of a slip ring body, positioned on a side of the connection lugs remote from the second carrier layer, wherein the electrically contacting contact strips electrically contact the electrically conducting signal path and the first and second electrically conducting ground paths via the connection lugs.

* * * * *